United States Patent [19]

Quinn

[11] 4,123,272
[45] Oct. 31, 1978

[54] DOUBLE-NEGATIVE POSITIVE-WORKING PHOTOHARDENABLE ELEMENTS

[75] Inventor: John A. Quinn, Morganville, N.J.

[73] Assignee: E. I. Du Pont de Nemours and Company, Wilmington, Del.

[21] Appl. No.: 797,832

[22] Filed: May 17, 1977

[51] Int. Cl.² .............................................. G03C 1/68
[52] U.S. Cl. ........................................ 96/35.1; 96/68; 96/115 P; 96/115 R
[58] Field of Search ...................... 96/35.1, 115 R, 68, 96/115 P

[56] References Cited

U.S. PATENT DOCUMENTS

| | | | |
|---|---|---|---|
| 3,157,505 | 11/1964 | Notley | 96/35.1 |
| 3,674,494 | 7/1972 | Hoffmann et al. | 96/35.1 |
| 3,787,211 | 1/1974 | Volkert et al. | 96/84 R |
| 3,808,004 | 4/1974 | Thomas et al. | 96/35.1 |

Primary Examiner—John D. Welsh

[57] ABSTRACT

A positive-working imaging element is described comprising a support coated first with a negative-working, solvent-developable, photohardenable stratum, then over-coated with a second negative-working, solvent-developable, photohardenable stratum; the second stratum serves as a mask for the first stratum since it contains ingredients which strongly absorb radiation actinic to the first stratum. The second stratum is imagewise exposed, solvent developed, and the resulting actinically opaque image used as a negative in exposing the first stratum, which is solvent developed to remove the composition in unexposed, but not in exposed areas. Optionally, a separating layer can be present between the photohardenable strata and a cover layer can be present over the second stratum. Positive-working low relief images suitable for lithographic printing plates, printed circuit resists, and contact-speed lithographic films are obtained from the elements of this invention.

19 Claims, 3 Drawing Figures

DOUBLE-NEGATIVE POSITIVE-WORKING PHOTOHARDENABLE ELEMENTS

BACKGROUND OF THE INVENTION
1. Field of the Invention

This invention relates to new photohardenable elements and to new processes for forming images. More particularly, it relates to photohardenable elements comprising double negative-working photohardenable strata.

2. Description of the Prior Art

Photohardenable elements are well known in the art for use in the graphic arts or printing fields. The photohardenable element is exposed imagewise, e.g., through a separate light stencil or photographic image-bearing transparency, to actinic radiation which causes the hardenable component of the composition to harden, e.g., photopolymerize or photocrosslink, and become substantially insoluble in the exposed areas. Following exposure, the element is treated to remove the soluble, unhardened composition in the unexposed but not the exposed areas. The resulting photohardened relief is useful as a planographic printing plate, a direct resist image, or a lithographic film.

In the imagewise exposure, the photographic transparency is usually placed in contact with the surface of the photohardenable element with this assembly in a vacuum printing frame. High vacuum is applied to insure uniform contact of the transparency with the surface of the photohardenable element, and the assembly exposed to a source of actinic radiation.

Frequently, when using this assembly, difficulties are encountered in maintaining adequate, uniform contact between the transparency and the surface of the photohardenable element. Although, usually, a vacuum of approximately 25 inches (63.5 cm) is used, the temperatures prevailing during exposure tend to expand entrapped air and vapors evolved from the photohardenable element, resulting in poor, nonuniform surface contact; poor contact can lead to distorted photohardened images.

Image-forming elements described in U.S. Pat. Nos. 3,245,793 and 3,730,717 which utilize a silver halide layer as overcoats on a photohardenable layer were devised to overcome the aforementioned problem. While effective for this purpose, the elements have certain disadvantages. They require the use of an expensive precious metal, silver, and are very susceptible to light other than so-called "safe" light. U.S. Pat. No. 3,245,793 requires the full silver halide development procedure, e.g., development and fixing. U.S. Pat. No. 3,730,717 utilizes photodevelopment with, however, special silver halide emulsions and photopolymer initiated systems.

SUMMARY OF THE INVENTION

In accordance with this invention improved photohardenable elements are provided which comprise, in order (a) a sheet or plate support; (b) a solid, negative-working, first solvent-developable photohardenable stratum; (c) a solid, negative-working, second solvent-developable photohardenable stratum containing radiation absorbers in the spectrum actinic for layer (b) in an amount sufficient to yield an optical density therein of at least 1.0 unit.

DESCRIPTION OF THE PREFERRED EMBODIMENT

Figure 1:
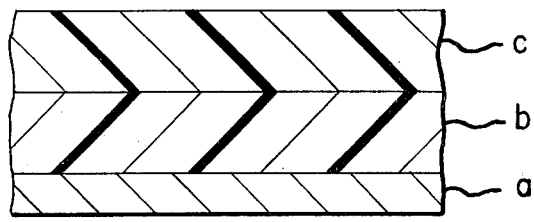
FIG. 1 is an enlarged elevational view in section of a photohardenable element.
Figure 2:
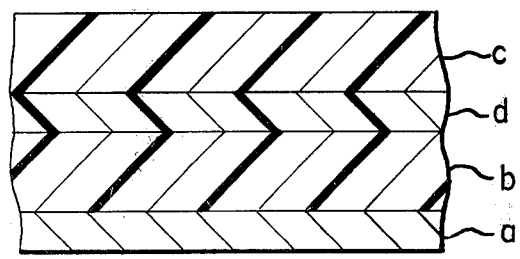
FIG. 2 is an enlarged elevational view in section of another photohardenable element.
Figure 3:
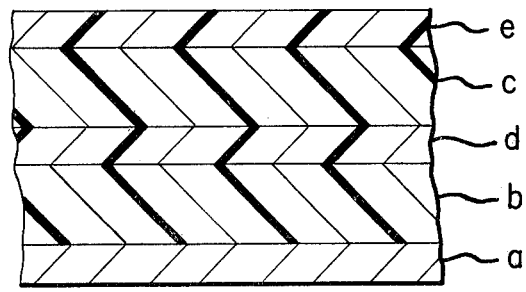
FIG. 3 is an enlarged elevational view in section of still another photohardenable element.

The photohardenable element of the invention in its simplest form is illustrated in FIG. 1 wherein (a) is a sheet or plate support; (b) is a solid, negative-working, first solvent-developable photohardenable stratum, and (c) is a solid, negative-working, second solvent-developable photohardenable stratum containing radiation absorbers in the spectrum actinic for stratum (b) in an amount sufficient to yield an optical density therein of at least 1.0 unit. This element is described in Example 5. Another photohardenable element embodiment is illustrated in FIG. 2 wherein between photohardenable strata (b) and (c) there is present a thin, transparent separating layer or film (d) inert to the second solvent developer of stratum (c). This element is described in Example 1. Still another photohardenable element embodiment is illustrated in FIG. 3 wherein in addition to support (a), photohardenable strata (b) and (c) and separating layer or film (d) there is present on stratum (c) a thin, transparent, oxygen-impermeable cover layer (e). This latter element is described in Examples 2 to 4, 6 and 7.

The terms "photohardenable" and "photopolymerizable" as used herein refer to systems in which the molecular weight of at least one component of the photosensitive layer is increased by exposure to actinic radiation sufficiently to result in a change in the rheological and thermal behavior of the exposed areas. Such systems comprise material with ethylenically unsaturated or benzophenone type groups. The photohardenable and photopolymerizable strata or layers are referred to herein as "negative-working, solvent-developable" which means that upon imagewise exposure to actinic radiation the unexposed image areas are developable in a suitable solvent for the particular stratum present in the element.

A preferred element of the invention comprises a transparent, hydrophobic, oxygen-impermeable film for support (a), separating film (d), and cover layer (e), wherein strata (b) and (c) are each a photopolymerizable stratum, less than 0.0006 inch (0.015 mm) thick, containing:

1. An ethylenically unsaturated compound capable of forming a high polymer by free radical initiated, chain propagating, addition polymerization, 10–30 parts by weight, 2. An organic polymeric binder, 10–60 parts by weight, 3. A free radical generating addition polymerization initiator system activatable by actinic radiation, 0.1–20 parts by weight, and, 4. A radiation absorber present in such concentration as to impart an optical density to the photopolymerizable layer of at least 3.0 over at least the spectral range of 300–500 nm, wherein the polymeric binders are selected so that the photopolymerizable composition is initially soluble in dilute aqueous alkaline solutions, but upon exposure to actinic radiation becomes relative insoluble therein.

Typically, polymers which satisfy these criteria are carboxylated, e.g., vinyl addition polymers containing free carboxylic acid groups.

The composite photohardenable elements described above are imagewise exposed, through optional layer (e), if present, to a radiation source to which photohardenable layer (c) is sensitive. The resultant relief image would then be developed by washing out the unexposed, soluble areas with a suitable solvent, i.e., second solvent. During this first exposure and development, layer (b) remains unaffected; layer (b) is not photohardened since layer (c) absorbs sufficient radiation actinic to layer (b) to substantially prohibit photohardening; layer (b) is unaffected by the developing solvent due to the presence of the separating layer (d), when present, or due to the different solvent susceptibilities of the two photohardenable layers when layer (d) is absent.

Imaged, developed layer (c) of the photohardenable element, thus, now stands ready to modulate exposure of layer (b). After this second exposure, the imaged areas of layer (c), the optional separating layer or film (d), if any, are removed and layer (b) is developed using the appropriate solvent(s), i.e., first solvent. A simple drying step then, yields support (a) bearing a photohardened image which is an exact replica of the original process transparency, i.e., is positive working. By the judicious selection of supports (a), photohardenable layers (b) and (c), separating layer (d) and cover layer (e), as described in detail hereinafter, suitable lithographic printing plates, resists for printed circuits, and dot etchable lithographic films are prepared.

The Support Layer (a)

Exposure of the photohardenable strata is always through layers (e), if present, and (c); it is never through support (a). Hence, support (a) can be, but is not necessarily, transparent. Accordingly, the nature of the support material will be determined by its imperviousness to oxygen where oxygen-sensitive photohardenable materials are used, and by the end use to which the process of the invention will be put. Known materials such as polyethylene terephthalate, glass, various types of paper, metal sheets, foils, e.g., aluminum, copper, etc. may be used as supports. The support may also bear thin subbing layers to improve adhesion of the photohardenable layer (b), reduce halation, etc. Indeed, firm adhesion between layers (a) and (b) is desired.

In the most preferred embodiment of the invention, when the final image is to serve as a positive-working, lithographic film, the support will be oriented polyethylene terephthalate bearing subbing layers as described in U.S. Ser. No. 741,039, filed Nov. 11, 1976 to achieve proper adhesion and washout.

Separating Layer (d)

A separating or barrier layer (d) between the two photohardenable layers is optional, but is preferred. When present, it is transparent, impervious to oxygen when layer (b) is oxygen-sensitive, and inert to developing solvent(s) used for layer (c). It is stripped from layer (b) after the second exposure and, therefore, it must readily fail adhesively from exposed layer (b). Finally, it should provide adequate adhesion between layers (b) and (c), and may also contain suitable subbing layers.

Suitable materials for layer (d) are well known in the art and are usually described therein as cover layers or films. (Note that layer (d), when present, may be considered a cover layer for layer (b).) Particularly suitable films, for the preferred photopolymerizable elements of the invention, are thin films of polyethylene terephthalate and polypropylene.

Cover Layer (e)

Layer (e), similar to layer (d) is also optional but is preferred. Indeed, layer (e) shares many requirements with layer (d), namely; it must be transparent, impervious to oxygen when layer (c) is oxygen-sensitive, readily fail adhesively where laminated to layer (c), following the first exposure, for stripping prior to developing layer (c). Of course, layer (e) adheres firmly enough to layer (c) to insure adequate protection from oxygen, humidity, abrasion, etc.

Suitable cover layers and films are well known in the art. Particularly convenient, for the preferred photohardenable elements, is any of the several commercially available varieties of polyethylene terephthalate or polypropylene film. Alternatively, any of a number of readily soluble polymeric materials, e.g., polyvinyl alcohol, may be coated in solution over the photohardenable stratum to leave, after removal of solvent, a hard, dry, nontacky surface. Depending on such factors as the degree of tackiness, oxygen sensitivity, etc. of the photohardenable stratum, the protective layer can be left in place during exposure or not, as desired.

Photohardenable Stratum or Layer (b)

Negative-working, photohardenable compositions, useful in layer (b), are those described in U.S. Pat. Nos. 3,245,793 and particularly in 3,730,717 regarding the photopolymerizable and photocrosslinkable component of the composite photohardenable element. The disclosures are incorporated herein by reference.

Particularly preferred are the aqueous-developable, photopolymerizable layers described in U.S. Ser. No. 741,039, filed Nov. 11, 1976; elements containing such layers, with their high optical density and thickness requirements, are especially useful as dot-etchable lithographic films.

Dot-etching of photohardenable layer (b) is accomplished after the element has been initially imagewise exposed, e.g., through a halftone screen, and the unexposed areas of the layers (b) and (c) have been removed. "Dot-etching" is the chemical undercutting and subsequent removal by mechanical action of the edges of the halftone dot image areas. Of course, other type images can also be etched by removing the edges of the image areas. The removal of the unexposed areas and etching can be carried out sequentially in a single pass through a developer apparatus suitably equipped with spray, brushing or other means to apply mechanical action to the dot or other image surface. Alternatively, these steps may be carried out by hand, as by immersion in developer and rubbing. The first step of the process, imagewise exposing layer (c), especially through a halftone screen, thus produces a dot etchable mask from an element of the invention. The mask contains a tone correctable image comprised of opaque polymeric dots which are reducible in size by mechanical action, as described above, on the image bearing surface of the mask.

A major utility of dot etching is in lithographic plate making, wherein a mask prepared is one of a plurality of color separation masks and the reduction of the size of the exposed areas (dots) is carried out to an extent whereby a composite color image produced with the masks (on a lithographic plate or on a proofing film) has the same tonal balance as the original color image. The elements of the invention are capable of thus functioning, thereby providing a new and improved replacement for silver halide litho masks.

Photohardenable Stratum or Layer (c)

This photohardenable layer can be the same or different from layer (b); however, it contains ingredients which strongly absorb radiation atinic (300–400 nm) to layer (b). The phrase "strongly absorbing" as used herein means that layer (c), both in its unhardened and hardened states, absorbs at least 90% of any actinic radiation which would be also incident to layer (b); i.e., the layer must transmit no more than 10% of the actinic radiation, i.e., possess an optical density of at least 1.0 in the region 300–400 nm.

Compounds, in addition to the photoinitiator system for photohardenable layer (c) itself, effective in absorbing actinic radiation, i.e., 300–400 nm, are present in the layer in relatively high concentrations. Mixtures of actinic absorbing photoinitiator systems, dyes and pigments are frequently used to provide the required adsorption over the spectral range.

Examples of ultraviolet dyes, ultraviolet absorbers and other dyes which can be used in this invention are:

particularly in U.S. Pat. No. 3,730,717 and U.S. Ser. No. 741,039, filed Nov. 11, 1976, are useful, and the pertinent disclosures therein are incorporated herein by reference.

Particularly preferred are composite elements wherein both layers (b) and (c) contain identical, thin, (i.e., less than 0.0006 inch, 0.015 mm thick), photopolymerizable layers with an optical density of at least 3.0.

Optional Components

The photohardenable compositions also can include a variety of photographic addenda utilized for their known purpose, such as agents to modify the flexibility of the coating, agents to modify its surface characteristics, dyes and pigments to impart additional color to the coating, agents to modify the adhesivity of the coating to the support, antioxidants, preservatives, and a variety of other addenda known to those skilled in the art.

Preparation of Photohardenable Elements

Coating compositions of this invention can be prepared by dispersing or dissolving the photohardenable constituents in any suitable solvent or combination of solvents used in the art to prepare coating fluids. The coating fluid corresponding to layer (b) would be applied to substrate (a) using conventional coating machines, then dried in a manner well known in the photographic art. This dried layer (b) could then be laminated to 2,2'-dihydroxy-4-methoxybenzophenone
4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
2-hydroxy-4-methoxybenzophenone
2,2'-dihydroxy-4,4'-dimethoxybenzophenone
2,2',4,4'-tetrahydroxybenzophenone
2-hydroxy-4-methoxybenzophenone-5-sulfonic acid
(also sodium salt of above)
ethyl-2-cyano-3,3-diphenylacrylate
2-ethylhexyl-2-cyano-3,3-diphenylacrylate

| | | |
|---|---|---|
| Luxol ® Orange GRL | (Color Index No. 25) | (Solvent Orange) |
| Luxol ® Orange GS | (Color Index No. 24) | (Solvent Orange) |
| Luxol ® Orange R | (Color Index No. 20) | (Solvent Orange) |
| Plasto ® Orange M | (Color Index No. 21) | (Solvent Orange) |
| Plasto ® Orange RS | (COlor Index No. 22) | (Solvent Orange) |
| Grasol ® Fast Orange (2RN) | (Color Index No. 33) | (Solvent Orange) |
| Oil Orange | (Color Index No. 12055) | (Solvent Yellow No. 14) |
| Sudan Orange RA | (Color Index No. 12055) | (Solvent Yellow No. 14) |
| Luxol ® Yellow G | (Color Index No. 45) | (Solvent Yellow) |
| Luxol ® Yellow T | (Color Index No. 47) | (Solvent Yellow) |
| Plasto ® Yellow GR | (Color Index No. 39) | (Solvent Yellow) |
| Plasto ® Yellow MGS | (Color Index No. 40) | (Solvent Yellow) |
| Oil Yellow 3G | (Color Index No. 29) | (Solvent Yellow) |
| Oil Yellow N | (Color Index No. 2) | (Solvent Yellow) |
| Sudan Yellow | (Color Index No. 30) | (Solvent Yellow) |
| Luxol ® Fast Blue AR | (Color Index No. 37) | (Solvent Blue) |
| Luxol ® Fast Black L | (Color Index No. 17) | (Solvent Black) |
| Primrose Yellow | (Color Index No. 77603) | (Pigment) |
| Chrome Yellow Light | (Color Index No. 77603) | (Pigment) |
| Chrome Yellow Medium | (Color Index No. 77600) | (Pigment) |
| Dispersed Manganese dioxide | | |
| Toluidine Yellow GW | (Color Index No. 71680 | (Pigment) |
| Molybdate Orange | (Color Index No. 77605) | (Pigment) |
| Dalamar Yellow | (Color Index No. 11741) | (Pigment) |
| Green Gold | (Color Index No. 12775) | (Pigment) |
| Graphtol Yellow | (Color Index No. Pigment Yellow No. 61) | |
| Graphtol Orange | (Color Index No. Pigment Orange No. 13 | |

Colloidal carbon is a particularly preferred pigment.

The other components of photohardenable layer (c) are known. As for photohardenable layer (b), the photoinitiators, unsaturated addition-polymerizable monomers, thermal polymerization inhibitors, photocrosslinkable polymers, organic polymeric binders, plasticizers, etc. as described in U.S. Pat. No. 3,245,793, and separatory film (d), overcoated with separatory layer (d), or overcoated with photohardenable layer (c). Following application (and drying) of layer (c), the element is either complete, or may be laminated to layer (e) in film form, or overcoated with cover layer (e).

Alternate coating paths would be obvious to those skilled in the art, and are in no way critical, as long as the two photohardenable layers are positioned as defined. For example, layer (b) could be coated on substrate (a), then laminated to separation film (d), by one coating line. In a second coater, layer (c) could be coated onto layer (e) in film form. Then, these two laminated to give the final composite photohardenable element. Additional conventional coating and/or laminating routes are known.

The Process

In carrying out the process of this invention, a photosensitive composite element is prepared as already described. Negative-working layer (c) is exposed to actinic radiation, preferably through the transparent cover layer (e). The exposure may be by means of a light source which is rich in ultraviolet radiation (300–400 nm) through a halftone image transparency, e.g., process negative or positive (an image-bearing transparency consisting solely of substantially opaque areas and substantially transparent areas where the opaque areas are substantially of the same optical density). Engineering drawings are also to be considered within the purview of the above description. The image or transparency may or may not be in operative contact with the surface of the element, e.g., contact exposure or projection exposure. For exposures through transparent cover layers (e), the time required will range from a few seconds to several minutes depending on the intensity of the exposing radiation and the inherent photographic speed of the photohardenable composition (c). After exposure, the cover layer is removed, if present, and exposed composition (c) with its completely exposed, hardened areas and its unexposed, unhardened areas is developed.

Since initiators activatable by actinic radiation generally exhibit their maximum sensitivity in the ultraviolet range (300–400 nm) the radiation source should furnish an effective amount of this radiation. Both point and broad radiation sources are effective. Such sources include carbon arcs, xenon arcs, mercury vapor arcs, fluorescent lamps with ultraviolet radiation emitting phosphors, argon glow lamps, electronic flash units and photographic flood lamps. Of these, the tungsten 1000W quartz iodide lamp is particular suitable. The sun lamp mercury-vapor arcs are customarily used at a distance of 3.8–61 cm from photosensitive layer (c). The point sources are generally used at a distance of 50–125 cm from the element.

Development of layer (c) is accomplished by washing out with a suitable solvent, by impingement of spray jets, with agitated immersion, brushing or scrubbing, to leave the desired actinically opaque, hardened, insoluble image. The copy obtained contains an imagewise distribution of an ultraviolet-absorbing material which serves as a mask for subsequently exposing photohardenable composition (b). Development conditions are sufficient to wash out substantially all the unexposed, unhardened areas down to separating layer (d), if present, or substantially down to layer (b) when layer (d) is absent.

The developer solvent selected depends upon the photohardenable composition. Thus, the solvent used in coating the composition can be used (providing that it does not attack the hardened areas too rapidly). Many photohardenable compositions may be conveniently developed with solvent mixtures as disclosed in U.S. Pat. No. 3,475,171. The more preferred aqueous developable photopolymerizable compositions are developed with aqueous bases, i.e., aqueous solutions of water-soluble bases in concentrations generally in the range from 0.01% to 10% by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; ammonium hydroxide and tetrasubstituted ammonium hydroxides, e.g., tetramethyl-, tetraethyl-, trimethylbenzyl-, and trimethylphenylammonium hydroxides, sulfonium hydroxides, e.g., trimethyl-, diethylmethyl-, dimethylbenzyl-sulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

As previously stated, the imagewise exposure and development processes for layer (c) leave layer (b) substantially unaffected. Layer (c) absorbs sufficient radiation actinic to layer (b) to substantially preclude photohardening. Separatory layer (d), when present, protects layer (b) from the solvent(s), abrasion, etc., employed in developing layer (c); its inclusion in the element is preferred for protective purposes.

In the absence of separating layer (d), development of imagewise exposed layer (c) becomes somewhat more critical. Thus, scrubbing or brushing to remove soft unexposed portions of layer (c) must be mild to prevent abrasive disturbance of unexposed, relative soft layer (b). Furthermore, the two photohardenable layers must have quite different solvent susceptibilities. This requirement provides no real hardship, however, since such photohardenable compositions are known in the art. For example, one layer could require organic solvent(s) for development, and be essentially inert to predominantly aqueous solvent(s). This type of composition, then, could be conveniently used in the inventive element when the other photohardenable layer relies on an aqueous developer.

After developing the image in layer (c), the image serves to modulate the second overall exposure of photohardenable layer (b), when exposed to a radiation source actinic to layer (b), i.e., 300–400 nm. Imaged layer (c) modulates this second exposure, since the imaged areas absorb radiation at 300–400 nm, whereas nonimaged areas of layer (c) transmit said actinic radiation for layer (b), since substantially all the actinic radiation absorber was washed out. Suitable radiation sources and conditions are those previously described as useful for the initial imagewise exposure of layer (c). Imaged layer (b), a negative image of that on initially exposed layer (c), is now ready for development following removal of imaged layer (c).

Preferably, the image of layer (c) has been developed on separatory layer (d), which is readily stripped from layer (b) after the second overall exposure. After stripping layer (b) is developed by suitable solvent(s), as previously described. Appropriate development, followed by drying, leaves imaged areas of layer (b) firmly adhering to support (a).

When separating layer (d) is absent, there is no intermediate layer to strip, and development may be effected immediately following the second exposure. This second exposure must be effective for photohardening layer (b) under the transparent, washed out areas of layer (c). This same exposure does not photoharden layer (b) under the actinically opaque image areas of layer (c). Thus, it is understood that the image of layer (c) will rest on unhardened, relative soft, layer (b). Furthermore, when the unhardened areas of layer (b) are wash-out developed, using the appropriate solvent(s), this dissolution or dispersing process will also carry away imaged areas of layer (c). Hence, again following drying, an image of layer (b), corresponding to a negative image of layer (c), will be adherent to support (a).

It will be seen, since both layers (b) and (c) are negative-working, that the novel element of this invention provides a method of producing a positive or negative low-relief image directly from a positive or negative process transparency, using a single element devoid of expensive silver. Such an element has utility for preparing positive-working, planographic printing plates, direct resists, etc. In a particularly preferred embodiment, i.e., with transparent, oxygen-impermeable films for layers (a), (d), and (e), and layers (b) and (c) both thin photopolymerizable compositions with optical densities at least 3.0 over the range 300–500 nm, the resultant image is useful as a dot-etchable, contact-speed lithographic film as described above. In this product, the final image also contains ingredients which highly absorb actinic radiation for an underlying photohardenable layer, i.e., can serve as a photomask.

EXAMPLES OF THE INVENTION

The invention is illustrated by the following examples, wherein parts and percentages of the strata or layers are by weight unless otherwise noted.

EXAMPLE 1

This example illustrates an element of the invention comprising a support (a), a pigmented photopolymerizable layer (b), a separatory layer (d), and a photocrosslinkable layer (c).

A. A black, aqueous alkaline developable, photopolymerizable composition was prepared containing the following ingredients:

|     | Layer (b) Components | Parts |
| --- | --- | --- |
| (a) | Terpolymer formed from 56% ethyl acrylate, 37% methyl methacrylate and 7% acrylic acid, Molecular weight ca. 260,000, acid number 76–85 | 16 |
| (b) | 1:1 copolymer of styrene and maleic anhydride, partially esterified with isopropyl alcohol, Molecular weight ca. 1700, acid number ca. 270 | 34 |
| (c) | Colloidal carbon (furnace black, particle size ca. 75 nm) | 15 |
| (d) | Triethylene glycol dimethacrylate | 19 |
| (e) | 2,2-Bis(2-chlorophenyl)-4,4',5,5'-tetraphenyl biimidazole | 10 |
| (f) | 4,4'-Bis(dimethylamino)benzophenone (Michler's ketone) | 5 |
| (g) | Hydroquinone | 1 |

A coating solution of these ingredients, 10% in methylene chloride, was coated via a doctor knife (0.004 inch, 0.1 mm, clearance) to yield a dry 0.0002 inch (0.0051 mm) thick layer (ca. 50 mg/dm$^2$), optical density >3.0 over 300–400 nm. The coating was applied to a 0.004 inch (0.1 mm) thick polyethylene terephthalate clear film support, prepared as described in Example IV of U.S. Pat. No. 2,779,684; further, this support (a) carried a modification of the subbing layer described in U.S. Pat. No. 3,443,950, to insure adequate adhesion but also to provide an aqueous alkali soluble layer. This modification consisted essentially of adding two acidic terpolymers in a weight ratio of approximately 1:2.1:4.6 (subbing:first polymer:second polymer) wherein the first polymer is formed from ethyl acrylate (56%), methyl methacrylate (37%) and acrylic acid (7%), and the second polymer is formed from 66% methyl methacrylate, 29% ethyl acrylate, and 5% methacrylic acid, to the substratum described in U.S. Pat. No. 3,443,950.

B. Separately, a photohardenable composition (c) was pour coated over the sub layer on a 0.004 inch (0.1 mm) thick polyethylene terephthalate clear film support, prepared as described in Example IV of U.S. Pat. No. 2,779,684, containing a resin sub layer on one side only (d). The photohardenable composition used was Kodak ® Photo Resist, Type 3, described in Technical Pamphlet P-86, Eastman Kodak Co., Rochester, New York; generically, the Kodak Photo Resists are polyvinyl cinnamates. The dried coating was about 0.0001 inch (0.0025 mm) thick, with an optical density of 0.2 (300–400 nm). This photohardenable-coated film was then laminated (50° C., ca. 10 lbs/lineal inch, 1 ft/min.) over the photopolymerizable coated film so that polyester film (d) separated the two photosensitive compositions.

The photohardenable composition (c) was then imagewise exposed (60 sec.) in a nuArc ® Flip-Top Platemaker (Model FT40M) to the carbon arc (approximately 2 ft, 61 cm, from the sample). After exposure, the unexposed, nonhardened areas of layer (c) were dissolved away via a vapor spray (30 seconds) of trichloroethylene.

Layer (b) was then given an overall exposure (2 minutes) to the above source, through film (d) bearing a photohardened image only in those areas where layer (c) has been originally exposed. Layer (d) bearing image (c) was then peeled off, and the exposed photopolymerizable layer (b), imagewise exposed via image (c), developed (20 sec., 72° F., 22° C.) in an aqueous solution containing Na$_2$CO$_3$ (1%) and NaHCO$_3$ (2%). A very faint, gray on black, completely unsatisfactory, positive image of the original transparency resulted in this control experiment, where the optical density of layer (c) was low, 0.2 unit.

However, when this experiment was repeated, but with layer (c) having an optical density of 1.2 units prior to exposure of layer (b), an entirely satisfactory, black on white (colorless), positive, photopolymerized image of layer (b) was obtained. These results were obtained by swabbing layer (c), before the exposure of layer (b) with "Kodak Photo Resist Black Dye" solution sufficiently to raise the optical density of layer (c) to 1.2 units (300–400 nm).

In this example, because of the low optical density of layer (c), it was necessary that the photospeed of layer (b) be reduced, via addition of hydroquinone, to avoid significant polymerization of layer (b) during the imagewise exposure of layer (c).

In the two experiments described above, some polymerization occurred in layer (b), during the imagewise exposure of layer (c), but this was minimized by deliberately making layer (b) photographically slow compared to layer (c); hydroquinone is a known polymerization inhibitor. In the control experiment, the exposure of layer (b) was insufficiently modulated by the low density image of layer (c); consequently, the resulting image from layer (b) was unsatisfactory. However, when the optical density of layer (b) was increased to 1.2 by the dye(s), it modulated the exposure of layer (b) and a satisfactory positive image on layer (b) was obtained.

EXAMPLE 2

The element described in this example contains five strata (a) to (e) as previously disclosed. Layer (c) is a blue-dyed photopolymerizable composition; the final, positive image is an orange-dyed photopolymer (b).

A. A coating solution was prepared containing the following ingredients as a 10% solution in methylene chloride:

|     | Layer (c) Components | Parts |
| --- | --- | --- |
| (a) | Terpolymeric binder (a) of Example 1 | 32 |
| (b) | Copolymeric binder (b) of Example 1 | 24 |
| (c) | Monomer (d) of Example 1 | 29 |
| (d) | Photoinitiator (e) of Example 1 | 7 |
| (e) | Photoinitiator (f) of Example 1 | 2 |
|     | 2,2'-Dihydroxy-4-methoxybenzo-phenone (UV absorber) | 2 |
|     | 2-(Stillyl-4''-)-(naphtho-1') 2',4,5)-1,2,3-triazol-2''-sulfonic acid phenyl ester (UV absorber) | 2 |
|     | 2-Mercaptobenzothiazole (hydrogen) donor, chain transfer agent) | 1 |
|     | Blue dye (C.I. 42595) | 1 |

This solution was then coated, via a doctor knife, 0.002-inch (0.051 mm) clearance, onto the treated side of electrically-discharge-treated polyethylene terephthalate (0.07 coulomb/ft$^2$). After drying to evaporate the solvent, the resulting film, ca. 0.0002-inch (0.0051 mm) thick, had an optical density of ~2.0 from 300-370 nm, falling to ~1.0 at 400 nm.

B. Separately, an orange-dyed photopolymerizable coating solution, 20% solids, was prepared in methylene chloride/methanol (90/10), from the following ingredients.

|     | Layer (b) Components | Parts |
| --- | --- | --- |
| (a) | Terpolymeric binder of Example 1 | 18 |
| (b) | Copolymeric binder of Example 1 | 30 |
| (c) | Monomer (d) of Example 1 | 15 |
| (d) | Photoinitiator (e) of Example 1 | 6 |
| (e) | Photoinitiator (f) of Example 1 | 3 |
| (f) | 2-Mercaptobenzothiazole | 1 |
| (g) | Grasol Fast Orange 2RN (C.I. Solvent Orange 33) | 27 |

The above coating solution was coated and dried with hot air onto polyethylene terephthalate (b 0.004-inch, 0.10 mm thick), which also contained the subbing layer described for coating the black photopolymerizable layer of Example 1. The dried coated was ca. 0.0003-inch, 0.0076 mm, thick, and had an optical density of ~4.0 units in the range 300-500 nm.

The element of this invention was then prepared by simultaneously laminating polypropylene (e), blue photopolymerizable layer (c) on polyethylene terephthalate (d), orange photopolymerizable layer (b) on subbed polyethylene terephthalate (a) at 80° C., substantially as described in Example 1. Layer (c) was then imagewise exposed (through polypropylene cover layer (e)) for 2 seconds to the xenon arc in a nuArc ® Flip-Top Platemaker (Model FT-26-L); the arc was ca. 19 inches, 48 cm., from the element.

Following exposure (of layer (c) only), the polypropylene cover sheet (e) was peeled off, and the exposed, blue, layer (c) developed (30 seconds in aqueous 3% NaHCO$_3$/1% Na$_2$CO$_3$, maintained at 26.7° C. The orange layer (b) was then given an overall exposure through developed layer (c) with the blue photopolymer image of (c) acting as a mask, to the same xenon source (30 seconds). Separatory film (d) was then peeled off, which also bore blue photopolymer image mask (c). Exposed orange layer (b) was then developed as above which left, after drying, a positive, orange, photopolymer image (b) on support (a). This final orange image, since it strongly absorbs radiation (optical density ~4.0) actinic to other photosensitive systems (300-500 nm), provides a useful photomask.

EXAMPLE 3

This example illustrates an element of the invention wherein layers (b) and (c) are identical black, pigmented, negative-working photopolymerizable compositions.

A. The black, photopolymerizable composition (c) of Example 1A, minus hydroquinone, was coated on polyethylene terephthalate (d) (0.001-inch, 0.025 mm thick) as in Example 1, to a dried coating weight of 60 mg/dm$^2$, ca. 0.00025-inch, 0.006 mm, thick, optical density >3.0 over 300-400 nm, and laminated with polypropylene (e), 0.001-inch, 0.025 mm, thick.

B. Separately, an identical coating composition (b) was likewise coated on subbed polyethylene terephthalate, (a) 0.007-inch, 0.178 mm, thick; the sub was identical to that described in Example 1A. These coated films were then laminated, as described in the previous examples, to yield the element of the invention, with polyethylene terephthalate film (d) separating the two photopolymerizable layers (b) and (c).

Layer (c) was imagewise exposed (35 seconds), through the polypropylene cover sheet (e), in a vacuum frame using a 400-watt mercury lamp 4 ft., 1.22 m, distant from the element; exposure was through a 150 line/in. half-tone transparency. After stripping off the cover sheet, exposed layer (c) was machine processed at 7 ft/min. through a reservoir (6 inches, 15.2 cm) of aqueous alkaline developer (2.4% Na$_2$CO$_3$, 0.4% NaHCO$_3$) maintained at 83° F., 28.3° C. Layer (c) was then sprayed (rinsed) with water (93° F., 33.9° C.) at 45 lbs/in$^2$, and air dried (150° F., 65.6° C.).

Simultaneously with drying, the element was also passing 3 in., 7.6 cm, from a 35-watt "Blacklight" (ultraviolet source) to expose layer (b) masked by the photopolymer image from layer (c). Following stripping of separating film (d), which bore image (c), exposed layer (b) was developed as described above for layer (c). The resulting dried film contained a black, dense (optical density >3.0, 300-400 nm) photopolymer image (b) on support (a), which was a positive replica of the original transparency. This product, further, provides a dot etchable, contact speed, lithographic film.

For example, a photopolymer printing plate, described in U.S. Pat. No. 3,458,311, was exposed through this mask for 20 seconds at 19 inches (48.3 cm) under a xenon arc. The line and halftone pattern was developed with the developer composition disclosed in the above patent and a suitable printing plate was obtained.

EXAMPLE 4

This example illustrates the use of an orange-dyed and a black-dyed, negative-working, photopolymerizable composition for layers (c) and (b), respectively, and use of an oxygen-impermeable barrier layer as the cover film (e).

A. Example 2B was repeated to yield, in this example, orange-dyed photopolymerizable as layer (c) on subbed polyethylene terephthalate (e).

Photopolymerizable layers are oxygen-sensitive and must be protected from oxygen of the air during exposure. This is frequently accomplished by use of a thin removable film, which is laminated to the surface of the photopolymer layer. It can also be accomplished by overcoating the photopolymer layer with a solution of an oxygen barrier polymer, which adheres to the photopolymer layer (after evaporation of its solvent), gives good oxygen protection, and is removable in the developer solvent. Such an overcoat solution (e), given below, was used in this example.

| Water | 1240 g |
|---|---|
| Polyvinyl alcohol (98–99% saponified, low viscosity) | 200 g |
| Copolymer of vinyl pyrrolidone/vinyl acetate (60/40, medium molecular weight) | 24.4 g |
| Ethyl cellosolve | 24.6 g |
| Polyoxyethylene surfactant of the formula | |
| 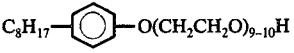 | 2.3 g |
| Denatured alcohol | 17.3 g |

For use in coating the composition of Example 2B, a solution containing 3.5% solids was prepared as follows:

| Water | 683 g |
|---|---|
| Overcoat solution above | 210 g |
| Surfactant above (10% aqueous solution | 5.4 ml |
| Blue Pigment (Inmont Blue 3G) | 1.8 g |

This solution was coated over the photopolymerizable layer using an extrusion die; the coated element was dried at 200° F. (93.3° C.). The dry coating weight (protective layer) was ca. 10 mg/dm². This overcoated film, as noted in Example 2B, had an optical density >4 between 300–500 nm.

B. The following ingredients were used for preparing layer (b):

| | Component | Parts |
|---|---|---|
| (a) | Copolymer of methyl methacrylate (90 mole %) and methacrylic acid (10 mole %), mol. wt. range about 30,000–50,000 | 38 |
| (b) | 2,2'-Bis(2-chlorophenyl)-4,4', 5,5'-tetraphenyl biimidazole | 6.0 |
| (c) | 4,4'-Bis(dimethylamino)benzophenone (Michler's ketone) | 2.3 |
| (d) | Mixed ester of triethylene glycol-dicaproate and dicaprylate, refractive index 1.4460 at 25° C. | 1.7 |
| (e) | Trimethylol propane triacrylate | 25 |
| (f) | 2-Mercaptobenzothiazole | 1.0 |
| (g) | Grasol® Fast Orange 2RN See Example 2B, (g) | 13 |
| (h) | Luxol® Fast Black L | |

| Component | Parts |
|---|---|
| (C.I. Solvent Black 17) | 13 |

The above materials were dissolved in methylene chloride/2-ethoxyethanol (7:3 ratio by volume) to yield a coating solution containing 20% solids. This solution was coated, as in the preceding examples, to yield a dried, photopolymerizable layer about 0.0003-inch, 0.0076 mm thick, onto the resin subbed substrate (a) of Example 1B.

The orange layer (c) was imagewise exposed (60 seconds), through overcoated barrier layer (e), via the xenon arc device described in Example 2. Development (30 seconds) in aqueous alkali (2.4% $Na_2CO_3$, 0.4% $NaHCO_3$) at 80° F., 26.7° C., removed both barrier layer (e) and unexposed areas of layer (c). After air-drying, layer (b) was given an overall exposure (60 seconds same xenon arc device), with the image of layer (c) acting as a mask. After removing separating film (d), which bore the mask (c), layer (b) was developed (30 seconds) in an aqueous developer (at 80° F., 26.7° C.) containing $Na_2CO_3$ (1%) and ethylene glycol monobutyl ether (12%). After drying, a useful, black, photopolymer image, which was a positive replica of the original target, remained on the clear support (a).

EXAMPLE 5

This example illustrates an opaque support (a), and operation minus separating layer (d) and protective layer (e). More specifically, the example demonstrates forming a positive image of the original target on a photopolymeric lithographic printing plate.

A. A negative-working photopolymerizable composition (b) was prepared containing the following ingredients:

| | Component | Parts |
|---|---|---|
| (a) | Copolymer of methyl methacrylate (90 mole %) and methacrylic acid (10 mole %), mol. wt. range about 30,000–50,000 | 62 |
| (b) | 2,2'Bis(2-chlorophenyl)-4,4', 5,5'-tetraphenyl biimidazole | 3.0 |
| (c) | 4,4'-Bis(dimethylamino)benzophenone (Michler's ketone) | 1.5 |
| (d) | Mixed ester of triethylene glycol-dicaproate and dicaprylate, refractive index 1.4460 at 25° C. | 7.5 |
| (e) | Trimethylol propane triacrylate | 25 |
| (f) | C.I. Solvent Red 109 | 1 |

The above ingredients were coated (20% solution in ethylene glycol monoethyl ether) onto, as substrate (a) grained aluminum (0.01 in., 0.25 mm, thick); the dried coating was ca. 50 mg/dm².

B. Layer (c) was prepared as described in Example 3A, except that it was coated onto polypropylene 0.00075-inch, 0.019 mm, thick. The two films were then laminated together, as described in Example 1, at 85° C., but with photopolymerizable layers (c) and (b) contiguous; the polypropylene film was then peeled off.

The black layer was then imagewise exposed (30 seconds) in a vacuum frame through a 150 line/in halftone positive transparency. The source was a 1000-watt, BRH tungsten-halogen lamp 3 ft., 0.914 m, from the sample. After exposure, the sample was developed (30 seconds) in aqueous alkali (1% $Na_2CO_3$, 3% $NaHCO_3$) at 73° F., 22.8° C. After drying, the black, optically dense (optical density >3 at 300–400 nm) was then ready to mask exposure of layer (b).

A second, overall exposure (45 seconds) of layer (b) was then made using the above light source, through the masking black photopolymer image. After development, 30 seconds at room temperature, with aqueous-/ethylene glycol monobutyl ether (6%), a photopolymeric image remained on the grained aluminum support, which was a positive replica of the original positive transparency. This dried final product was useful as a lithographic printing plate.

EXAMPLE 6

This example illustrates the utility of the invention for preparing resists on copper-plated, printed circuit boards as substrate (a). Layer (c) is a negative-working, black, pigmented photopolymer composition; layer (b) is a negative-working photocrosslinkable composition.

A. Example 3A was repeated, except that the polypropylene cover sheet (e) was 0.00075-inch, 0.019 mm, thick. Layer (c) had an optical density >3 over 300–400 nm; layer (d) was polyethylene terephthalate, 0.001-inch, 0.025 mm, thick.

B. Separately, Kodak ® Photo Resist, Type 3 (b) (see Example 1B) was flow coated onto clean, copper clad, epoxy fiber glass boards (a). After drying, these two elements were laminated (85° C., as in Example 1) to form the composite element of the invention; the polyethylene terephthalate film (d) separated layers (b) and (c).

The black layer (c) was then exposed (20 seconds) through the polypropylene cover film. The radiation source and distance was as described in Example 5; the initial exposure was through a positive transparency bearing an image simulating a printed circuit. After exposure, the polypropylene film was removed, and layer (c) developed as the same layer was developed in Example 5. A black, optically dense (optical density >3, at 300–400 nm), negative photopolymer image remained, which, after drying, served as a mask in exposing layer (b).

The photohardenable layer (b) was then overall exposed, through mask (c), exactly as the Kodak Photo Resist, Type 3 layer was exposed in Example 1, i.e., 60 seconds, nuArc ® FT-40M. After removing the polyethylene terephthalate layer (d), which bore image (c), the unexposed photocrosslinkable areas of layer (b) were removed via a vapor spray (20 seconds) of trichloroethylene. After drying, the resulting positive, photocrosslinked image was useful as a resist. The copper, in the unprotected areas, was etched (60 seconds) in a spray of ferric chloride (42° Baume), at 135° F., 57.2° C. Removing the resist then revealed the remaining copper circuit reproducing the pattern of the original process transparency.

EXAMPLE 7

This example is related to Example 4, in that it is also overcoated with an oxygen-barrier layer (e). It employs two negative-working, black, pigmented photopolymerizable layers, one of which (b) uses an alternate formulation.

A. Layer (c) on separatory film (d) was prepared as in Example 3A, which was subsequently overcoated with layer (e) as in Example 4A. As previously reported, this layer strongly absorbed radiation in the range 300–400 nm, i.e., optical density >3.0.

B. Separately, layer (b) was prepared from the following ingredients:

| | Component | Parts |
|---|---|---|
| (a) | High molecular weight tetrapolymeric binder from butyl acrylate (25%), methyl methacrylate (30%), acrylonitrile (30%), methacrylic acid (15%) | 32 |
| (b) | Copolymeric binder (b) of Example 1 | 17 |
| (c) | Colloidal carbon (c) of Example 1 | 17 |
| (d) | Monomer (d) of Example 1 | 21 |
| (e) | Photoinitiator (e) of Example 1 | 9 |
| (f) | Photoinitiator (f) of Example 1 | 4 |

The above ingredients, dissolved in methylene chloride/2-ethoxy ethanol, were coated onto the support (a) over the wash-off sub described in Example 1A, to yield a dried coating 0.0002-inch, 0.0051 mm, optical density >3.0 over 300–400 nm.

These two coated films were subsequently laminated to form the composite element of the invention, substantially as described in Example 1, with the polyethylene terephthalate base of Part A becoming separatory layer (d). Layer (c) was then imagewise exposed (30 seconds) through overcoat barrier layer (e) in a vacuum frame, through a 150 line/in half-tone transparency to the lamp and distance described in Example 5. The image was then developed (5 seconds) in dilute aqueous alkali (2.4% $Na_2CO_3$/0.4% $NaHCO_3$) at room temperature.

Overall exposure (15 seconds) of layer (b), through masking image (c), was effected using the same radiation source as above. Also, identical development gave, after drying, a positive image of the original transparency. The resulting transparency, which is not etchable without substantial loss of top density, is useful as a mask for imaging a lithographic plate. Dot etching may be effected with the developer solvent and light abrasive action.

I claim:

1. A photohardenable element comprising in order
   (a) a sheet or plate support;
   (b) a solid, negative-working, first solvent-developable photohardenable stratum;
   (c) a solid, negative-working, second solvent-developable photohardenable stratum containing radiation absorbers in the spectrum actinic for stratum (b) in an amount sufficient to yield an optical density therein of at least 1.0 unit.

2. An element according to claim 1 wherein at least one of photohardenable strata (b) and (c) has an optical density in its actinic radiation region of at least 3.0 and has a maximum thickness of 0.0006 inch.

3. An element according to claim 1 wherein a thin, transparent separating layer or film (d) inert to said second solvent developer of stratum (c) is present between strata (b) and (c).

4. An element according to claim 3 wherein the first and second solvents are the same.

5. An element according to claim 1 wherein a thin, transparent, oxygen-impermeable layer (e) is present on stratum (c).

6. An element according to claim 1 wherein the photohardenable strata comprise material with ethylenically unsaturated or benzophenone type groups.

7. An element according to claim 2 wherein both photohardenable strata have an optical density in their actinic region of at least 3.0 and have a maximum thickness of 0.0006 inch.

8. An element according to claim 7 wherein a thin, transparent separating layer or film (d) inert to said second solvent developer of stratum (c) is present between strata (b) and (c), and a thin, transparent, oxygen-impermeable layer (e) is present on layer (c).

9. An element according to claim 8 wherein the photohardenable strata are photopolymerizable containing (1) an ethylenically unsaturated compound capable of forming a high polymer by free radical initiated, chain propagating, addition polymerization; (2) an organic polymer binder, and (3) a free radical generating addition polymerization initiator system activatable by actinic radiation.

10. A process which comprises exposing, imagewise to actinic radiation a photohardenable element comprising in order
   (a) a sheet or plate support;
   (b) a solid, negative-working, first solvent-developable photohardenable stratum;
   (c) a solid, negative-working, second solvent-developable photohardenable stratum containing radiation absorbers in the spectrum actinic for stratum (b) in an amount sufficient to yield an optical density therein of at least 1.0 unit;
removing the unexposed areas of stratum (c) with said second solvent which has no affect on stratum (b); exposing the resulting element to actinic radiation through the remainder of stratum (c) until the exposed areas of photohardenable stratum (b) are polymerized without polymerization in the unexposed areas; removing the exposed areas of stratum (c) and removing the unexposed areas of stratum (b) with said first solvent.

11. A process according to claim 10 wherein the exposed areas of stratum (c) are stripped to remove them from stratum (b).

12. A process according to claim 10 wherein the exposed areas of stratum (c) and the unexposed areas of stratum (b) are removed with said first solvent.

13. A process according to claim 10 wherein the photohardenable element contains a thin, transparent separating layer or film (d) inert to the second solvent and said separating layer or film (d) is removed from the surface of stratum (b) after exposing imagewise stratum (b).

14. A process according to claim 13 wherein a thin, transparent, oxygen-impermeable layer (e) is present on stratum (c) and is removed after the initial imagewise exposure of the photohardenable element.

15. A process according to claim 10 wherein at least one of photohardenable strata (b) and (c) has an optical density in its actinic radiation region of at least 3.0 and has a maximum thickness of 0.0006 inch.

16. A process according to claim 13 wherein the first and second solvents are the same.

17. A process according to claim 10 wherein the photohardenable strata comprise a material with ethylenically unsaturated or benzophenone type groups.

18. A process according to claim 15 wherein both photohardenable strata have an optical density in their actinic region of at least 3.0 and have a maximum thickness of 0.0006 inch.

19. A process according to claim 18 wherein the photohardenable strata are photopolymerizable containing (1) an ethylenically unsaturated compound capable of forming a high polymer by free radical initiated, chain propagating, addition polymerization; (2) an organic polymer binder, and (3) a free radical generating addition polymerization initiator system activatable by actinic radiation.

* * * * *